US010707226B1

United States Patent
Yang et al.

(10) Patent No.: US 10,707,226 B1
(45) Date of Patent: Jul. 7, 2020

(54) SOURCE SIDE PROGRAM, METHOD, AND APPARATUS FOR 3D NAND

(71) Applicant: SanDisk Technologies LLC, Addison, TX (US)

(72) Inventors: Xiang Yang, San Jose, CA (US); Brian Murphy, San Jose, CA (US); Lito De La Rama, San Jose, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/453,268

(22) Filed: Jun. 26, 2019

(51) Int. Cl.
*G11C 16/34* (2006.01)
*H01L 27/1157* (2017.01)
*G11C 16/08* (2006.01)
*G11C 16/12* (2006.01)
*G11C 16/04* (2006.01)

(52) U.S. Cl.
CPC ...... *H01L 27/1157* (2013.01); *G11C 16/0483* (2013.01); *G11C 16/08* (2013.01); *G11C 16/12* (2013.01)

(58) Field of Classification Search
None
See application file for complete search history.

(56) References Cited

U.S. PATENT DOCUMENTS

| 2014/0289559 | A1* | 9/2014 | Hashimoto | G11C 29/08 714/27 |
| --- | --- | --- | --- | --- |
| 2015/0049549 | A1* | 2/2015 | Asaoka | G11C 16/10 365/185.12 |
| 2018/0151236 | A1* | 5/2018 | Park | G11C 11/5628 |
| 2019/0214100 | A1* | 7/2019 | Puthenthermadam | G11C 11/5671 |
| 2019/0235954 | A1* | 8/2019 | Gim | G11C 29/028 |

\* cited by examiner

*Primary Examiner* — Tan T. Nguyen
(74) *Attorney, Agent, or Firm* — Dickinson Wright PLLC; Steven Hurles

(57) ABSTRACT

A source side programming method and system are provided. A bad trigger block, of a plurality of blocks of a memory array, may be detected by determining a threshold voltage distribution of a drain side select gate of a block and determining whether the distribution is abnormal. If the distribution is abnormal, the block is a bad trigger block which may cause a failure in another block. IF the block is a bad trigger block, source side programming is performed on at least one word line of the bad trigger block by applying a non-zero voltage to at least one source side word line of the bad trigger block via a source side line.

12 Claims, 11 Drawing Sheets

SOURCE SIDE PROGRAM, METHOD, AND APPARATUS FOR 3D NAND

BACKGROUND

1. Field

Systems, apparatuses, and methods consistent with exemplary embodiments relate to programming of three dimensional (3D) NAND flash memories, and more specifically source side programming of 3D NAND flash memory devices.

2. Description of the Related Art

3D NAND flash memory is a type of non-volatile flash memory in which memory cells are stacked vertically in multiple layers. 3D NAND was developed to address challenges encountered in scaling two dimensional (2D) NAND technology to achieve higher densities at a lower cost per bit.

A memory cell is an electronic device or component capable of storing electronic information. Non-volatile memory may utilize floating-gate transistors, charge trap transistors, or other transistors as memory cells. The ability to adjust the threshold voltage of a floating-gate transistor or charge trap transistor allows the transistor to act as a non-volatile storage element (i.e. a memory cell), such as a single-level cell (SLC) which stores a single bit of data. In some cases more than one data bit per memory cell can be provided (e.g., in a multi-level cell) by programming and reading multiple threshold voltages or threshold voltage ranges. Such cells include, but are not limited to a multi-level cell (MLC), storing two bits per cell; a triple-level cell (TLC), storing three bits per cell; and a quad-level cell (QLC), storing four bits per cell.

FIG. 1 illustrates a diagram of an exemplary 3D NAND memory 100. The memory 100 includes multiple physical layers that are monolithically formed above a substrate 34, such as a silicon substrate.

Storage elements, for example memory cells 301, are arranged in arrays in the physical layers. A memory cell 301 includes a charge trap structure 44 between a word line 300 and a conductive channel 42. Charge can be injected into or drained from the charge trap structure 44 via biasing of the conductive channel 42 relative to the word line 300. For example, the charge trap structure 44 can include silicon nitride and can be separated from the word line 300 and the conductive channel 42 by a gate dielectric, such as a silicon dioxide. An amount of charge in the charge trap structure 44 affects an amount of current through the conductive channel 42 during a read operation of the memory cell 301 and indicates one or more bit values that are stored in the memory cell 301.

The 3D memory 100 includes multiple erase blocks 80. Each block 80 includes a "vertical slice" of the physical layers that includes a stack of word lines 300. Multiple conductive channels 42 (having a substantially vertical orientation, as shown in FIG. 1) extend through the stack of word lines 300. Each conductive channel 42 is coupled to a storage element in each word line 300, forming a NAND string of storage elements, extending along the conductive channel 42. FIG. 1 illustrates three blocks 80, five word lines 300 in each block 80, and three conductive channels 42 in each block 80 for clarity of illustration. However, the 3D memory 100 can have more than three blocks, more than five word lines per block, and more than three conductive channels per block.

A read/write circuitry 68 is coupled to the conductive channels 420 via multiple conductive lines: bit lines, illustrated as a first bit line BL0, a second bit line BL1, and a third bit line BL2 at a first end of the conductive channels (e.g., an end most remote from the substrate 34) and source lines, illustrated as a first source line SL0, a second source line SL1, and a third source line SL2, at a second end of the conductive channels (e.g., an end nearer to or within the substrate 234). The read/write circuitry 68 is illustrated as coupled to the bit lines BL0-BL2 via "P" control lines, coupled to the source lines SL0-SL2 via "M" control lines, and coupled to the word lines 300 via "N" control lines. Each of P, M, and N can have a positive integer value based on the specific configuration of the 3D memory 100.

Each of the conductive channels 42 is coupled, at a first end to a bit line BL, and at a second end to a source line SL. Accordingly, a group of conductive channels 42 can be coupled in series to a particular bit line BL and to different source lines SL.

It is noted that although each conductive channel 42 is illustrated as a single conductive channel, each of the conductive channels 42 can include multiple conductive channels that are in a stack configuration. The multiple conductive channels in a stacked configuration can be coupled by one or more connectors. Furthermore, additional layers and/or transistors (not illustrated) may be included as would be understood by one of skill in the art.

The read/write circuitry 68 facilitates and/or effectuates read and write operations performed on the 3D memory 100. For example, data can be stored to storage elements coupled to a word line 300 and the read/write circuitry 68 can read bit values from the memory cells 301 using one or more sense blocks 36. As another example, the read/write circuitry 68 can apply selection signals to control lines coupled to the word lines 300, the bit lines BL, and the source lines SL to cause a programming voltage (e.g., a voltage pulse or series of voltage pulses) to be applied across selected storage element(s) 44 of the selected word line 300.

FIG. 2 illustrates a related art method of programming a 3D NAND word line (WL). When a program command is received (101), a program loop 120 is initiated, and multiple iterations 1, 2, . . . n of the program loop are performed. A "program loop" is a period of time encompassing a programming pulse and extending until another programming pulse is issued or until a particular program procedure comes to an end.

Traditionally, NAND memory is programmed from the drain side, meaning that the data is loaded from bit lines. Cells to be programmed are biased to 0V and inhibited (e.g. to 3V or VddSA). During programming, word lines above the selected word line (i.e. drain side word lines) are turned on, while source side word lines are cut off.

Each 3D NAND memory comprises a plurality of blocks (e.g. 2000 blocks) divided into two planes and connected to a sense amplifier. It is not uncommon for one or more blocks to include a defect due, for example, to manufacturing. A block that doesn't function properly due to a defect is referred to as a "bad block." When a bad block is discovered, it is identified as a bad block. The NAND circuit has a mapping that specifies which blocks are working and which are not working, and a bad block may be marked by a flag. During user operations, the NAND circuit will not allow the user to access the bad block. In theory, a bad block does not, itself, function, but it also does not affect any other blocks.

SUMMARY

Exemplary embodiments may address at least the above problems and/or disadvantages and other disadvantages not described above. Also, exemplary embodiments are not required to overcome the disadvantages described above, and may not overcome any of the problems described above.

According to an aspect of an exemplary embodiment, a non-volatile memory storage system comprises a memory cell array comprising a plurality of blocks of memory cells; and a detection circuit. The detection circuit is configured to detect a threshold voltage distribution on a drain side select gate of a suspected block of the plurality of blocks of memory cells; to determine whether the threshold voltage distribution is abnormal; and upon determining that the threshold voltage is abnormal, determine that the suspected block is a bad trigger block.

According to an aspect of another exemplary embodiment, a non-volatile memory storage system comprises a memory cell array comprising a plurality of blocks of memory cells; and a programming circuit. The programming circuit comprises: a marking circuit configured to, upon determination that a block, of the plurality of blocks, includes a fault, marking the block as a bad block; a detection circuit configured to detect a threshold voltage distribution on a drain side select gate of the bad block and to determine whether the threshold voltage distribution is abnormal; and a source-side programming circuit configure to, upon determination that the threshold voltage is abnormal, applying a voltage to at least one word line of the bad block via a source-side of the memory cell array.

The memory cell array may be 3D NAND flash memory.

The source-side programming circuit may apply the voltage to the at least one word line by: driving a drain side bit line and a drain side select gate of the bad block at 0V; applying a non-zero voltage to a source side select gate of the bad block; and driving a source line connected to the bad block at 0V.

According to an aspect of another exemplary embodiment, a method of detecting a bad trigger block within a memory cell array is provided, wherein the memory cell array comprises a plurality of blocks of memory cells. The method comprises detecting a threshold voltage distribution on a drain side select gate of a suspected block of the plurality of blocks of memory cells; determining whether the threshold voltage distribution is abnormal; and upon determining that the threshold voltage distribution is abnormal, determining that the suspected block is a bad trigger block.

According to an aspect of another exemplary embodiment, a programming method comprises: determining that a block, of a plurality of blocks of a memory cell array, includes a fault; upon determination that the block includes a fault, marking the block as a bad block; detecting a threshold voltage distribution on a drain side select gate of the bad block; determining whether the threshold voltage distribution is abnormal; and if the threshold voltage distribution is abnormal, applying a voltage to at least one word line of the bad block via a source-side of the memory cell array.

The memory cell array may be 3D NAND flash memory.

The application of the voltage to at least one word line of the bad block via the source-side of the memory cell array may comprise: driving a drain-side bit line and a drain side select gate of the bad block at 0V; applying a non-zero voltage to a source side select gate of the bad block; and driving a source line connected to the bad block at 0V.

According to an aspect of another exemplary embodiment, a non-volatile computer-readable medium has recorded thereon a program which, when executed by a processor, causes the processor to execute one or more of the methods as described above.

BRIEF DESCRIPTION OF THE DRAWINGS

The above and/or other aspects will become apparent and more readily appreciated from the following description of exemplary embodiments, taken in conjunction with the accompanying drawings in which.

DETAILED DESCRIPTION

Figure 1:
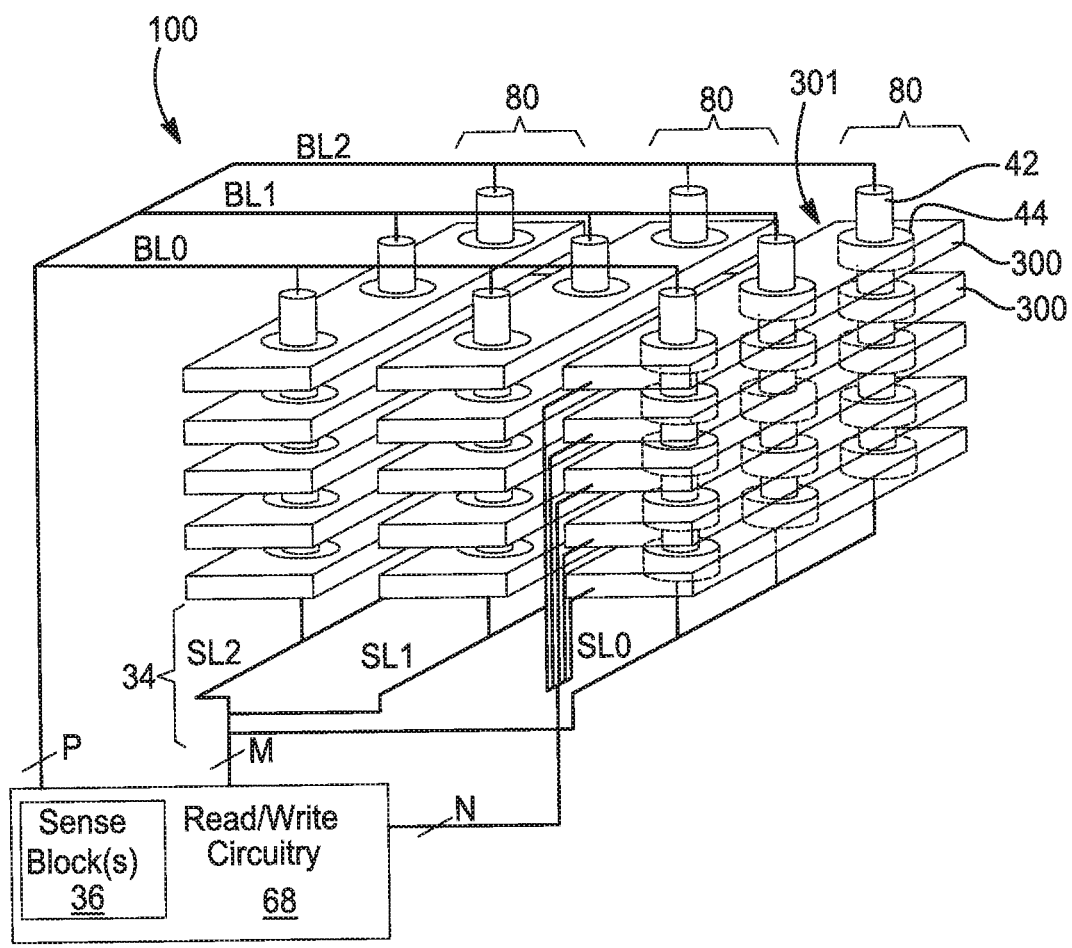
FIG. 1 illustrates a diagram of an exemplary 3D NAND memory.
Figure 2:
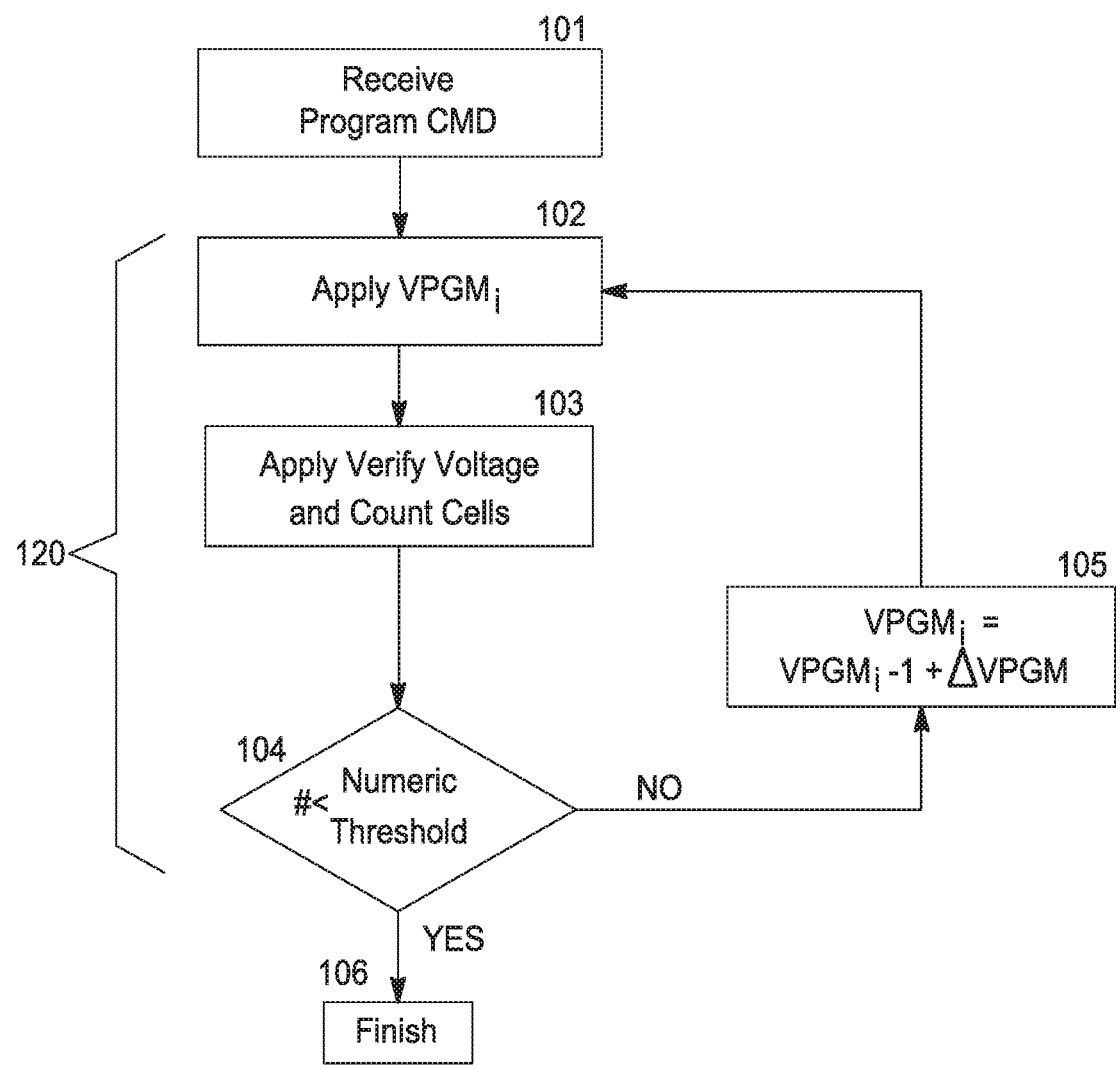
FIG. 2 illustrates a related art method of programming a 3D NAND word line (WL)

Reference will now be made in detail to exemplary embodiments which are illustrated in the accompanying drawings, wherein like reference numerals refer to like elements throughout. In this regard, the exemplary embodiments may have different forms and may not be construed as being limited to the descriptions set forth herein.

It will be understood that the terms "include," "including", "comprise, and/or "comprising," when used in this specification, specify the presence of stated features, integers, steps, operations, elements, and/or components, but do not preclude the presence or addition of one or more other features, integers, steps, operations, elements, components, and/or groups thereof.

It will be further understood that, although the terms "first," "second," "third," etc., and "primary," secondary," tertiary," etc., may be used herein to describe various operations, elements, components, regions, layers and/or sections, these operations, elements, components, regions, layers and/or sections may not be limited by these terms. These terms are used only to distinguish one element, component, region, layer or section from another element, component, region, layer or section.

As used herein, the term "and/or" includes any and all combinations of one or more of the associated listed items. Expressions such as "at least one of," when preceding a list of elements, modify the entire list of elements and do not modify the individual elements of the list. In addition, the terms such as "unit," "-er," "-or," "module," and "unit" described in the specification refer to an element for performing at least one function or operation, and may be implemented in hardware, software, or the combination of hardware and software.

Various terms are used to refer to particular system components. Different companies may refer to a component by different names—this document does not intend to distinguish between components that differ in name but not in function.

A detailed description of matters of these exemplary embodiments that are obvious to those of ordinary skill in the technical field to which these exemplary embodiments pertain may be omitted herefrom.

This description references 3D NAND memory devices. However, it should be understood that the description herein may be likewise applied to other memory devices.

As used herein, the term "memory" denotes semiconductor memory. Types of semiconductor memory include volatile memory and non-volatile memory. Non-volatile memory allows information to be stored and retained even when the non-volatile memory is not connected to a source of power (e.g., a battery). Examples of non-volatile memory include, but are not limited to, flash memory (e.g., NAND-type and NOR-type flash memory), Electrically Erasable Programmable Read-Only Memory (EEPROM), ferroelectric memory (e.g., FeRAM), magnetoresistive memory (e.g., MRAM), spin-transfer torque magnetic random access memory (STT-RAM or STT-MRAM), resistive random access memory (e.g., ReRAM or RRAM) and phase change memory (e.g., PRAM or PCM).

As discussed above, in theory, a bad block does not affect the function of other blocks. However, it has been discovered by the present inventors that, in certain cases, a block that has been determined to be a bad block will affect other blocks. Such a bad block is referred to as a "bad trigger block" (BTB)—a bad block which can trigger the failure of one or more other blocks because it is not electrically independent.

Figure 3:
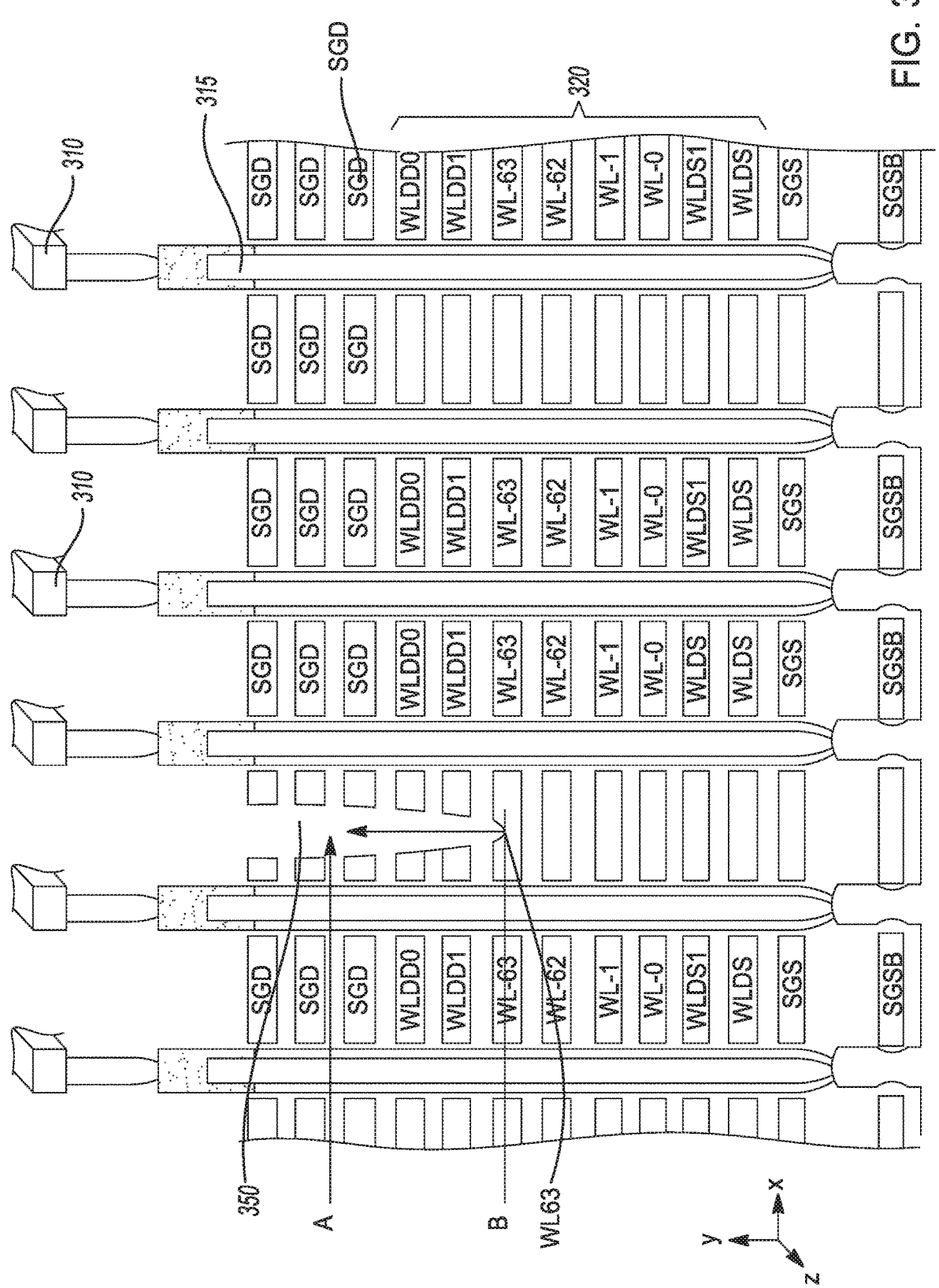
FIG. 3 illustrates a schematic cross-section of one portion of a 3D NAND memory showing a bad trigger block, according to an exemplary embodiment.

FIG. 3 illustrates a schematic cross-section of one portion of 3D NAND showing a bad trigger block. Bad trigger blocks can include any of many different types of defects, formed in any of various different ways, and FIG. 3 illustrates one exemplary type of bad trigger block. The 3D NAND includes bit lines 310 connected to a plurality of memory holes 315, and layers of word lines 320. In this example there is a defect 350 in one of the blocks. The defect is formed through the tungsten of the word lines.

Due to the defect 350, the bad trigger block itself does not function because the defect 350 causes a break in the word lines 320 and drain side select gate (SGD). Each block can be driven from either of a first side of the array and a second side of the array, the signal propagating from one side of the word line to the other side of the array. For example, in FIG. 3, the select gate drain (SGD) may be driven from the left side to the right side, as shown by arrow A, ideally propagating through the word line to the other side of the array. However, due to the defect 350 in the block, the signal A propagating on the SGD from the left side of the array cannot continue past the defect 350 which cuts through the word lines in the y direction and also extends in the +/−z direction. Any signal initiated on the SGD driver cannot propagate to the opposite side of the array.

Accordingly, the bad trigger block cannot function. Additionally, however, the defect 350 may also cause other "good" blocks within the same EOC group, to malfunction.

During a read/verify sensing operation, a group of blocks (an "EOC group") are biased together. When the bad trigger block (BTB) is included in an EOC group, in the process of programming a good block in the same EOC, a word line in the bad trigger block is biased. As can be seen in FIG. 3, word line WL63 includes a region adjacent to the defect 350. Thus, when the word line WL63 in the bad trigger block is biased, the EOC bias voltage is also conducted up the defect 350, as shown by arrow B in FIG. 3. This means that, in an instance in which the source side of the bad block should be at 0V, the SGD in the bad block has been charged to the EOC bias.

Figure 4:
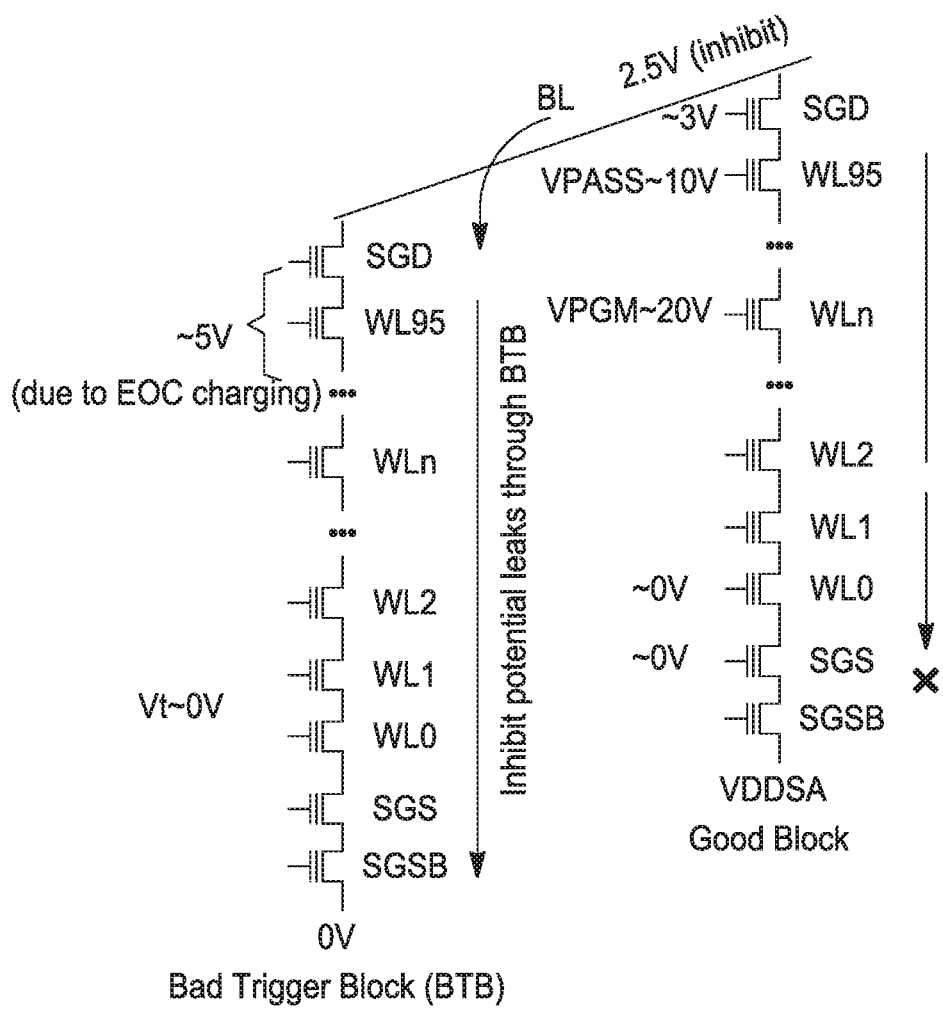
FIG. 4 provides a diagrammatic representation of a bad trigger block (BTB) and a good block, according to an exemplary embodiment.

FIG. 4 provides a diagrammatic representation of a bad trigger block BTB and a good block. When the programming of the good block continues after the EOC bias has been applied, the program bit line in the good block is driven at 0V, and the inhibit bit line in the good block is driven at an inhibit voltage (e.g. 2.5V), as shown in FIG. 4. A problem then arises due to the unwanted EOC bias on the SGD in the bad trigger block. The bad trigger block and the good block are connected via the bit line acting as the inhibit bit line in the good block. Because the SGD in the bad trigger block is at the EOC trigger voltage, rather than at 0V, the inhibit voltage on the bit line will be conducted down the memory hole in the leakage path shown in FIG. 4. This leakage path through the bad trigger block pulls down the inhibit voltage in the bit line to less than intended (e.g. from 2.5V to 2V or 1V). This lower voltage on the inhibit bit line means that it does not function as an inhibit voltage in the good cell, and the cell in the good block that should be inhibited, will actually be programmed up.

Figure 5:
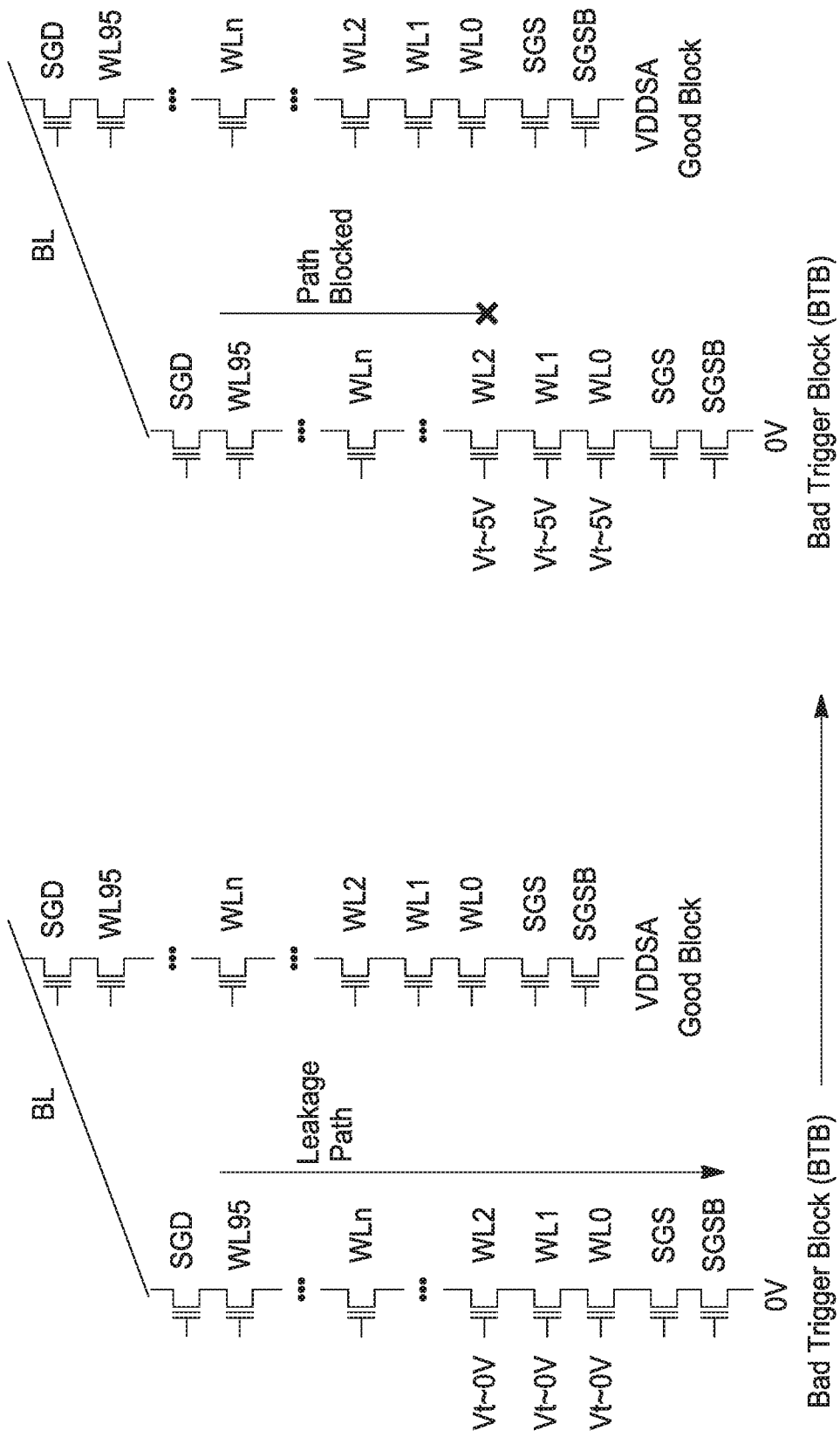
FIG. 5 provides diagrammatic representations of a good block and a bad trigger block in two states according to an exemplary embodiment.

FIG. 5 provides diagrammatic representations of a good block and a bad trigger block in two states according to a first exemplary embodiment.

A shown on the left in FIG. 5, and as discussed above with respect to FIG. 4, when the common bit line conducts the inhibit voltage, it is conducted down the leakage path in the bad trigger block causing the good block to fail. One solution is to block the leakage path in the bad block. According to this exemplary method, when the bad trigger block is identified, word lines WL0, WL1, and WL2 in the bad trigger block are programmed to a high Vt state (e.g. 5V or 7V) such that it is higher than any voltage operating on the EOC block, and whatever voltage is thereafter applied cannot turn on the corresponding transistors, thus blocking the leakage path, as shown on the right in FIG. 5.

As described above, the programming of the SGD causes a programming failure in a good block due to the presence of a bad trigger block in the same EOC. Thus second exemplary embodiment provides a programming method in which the SGD remains off.

Figures 6A, 6B:
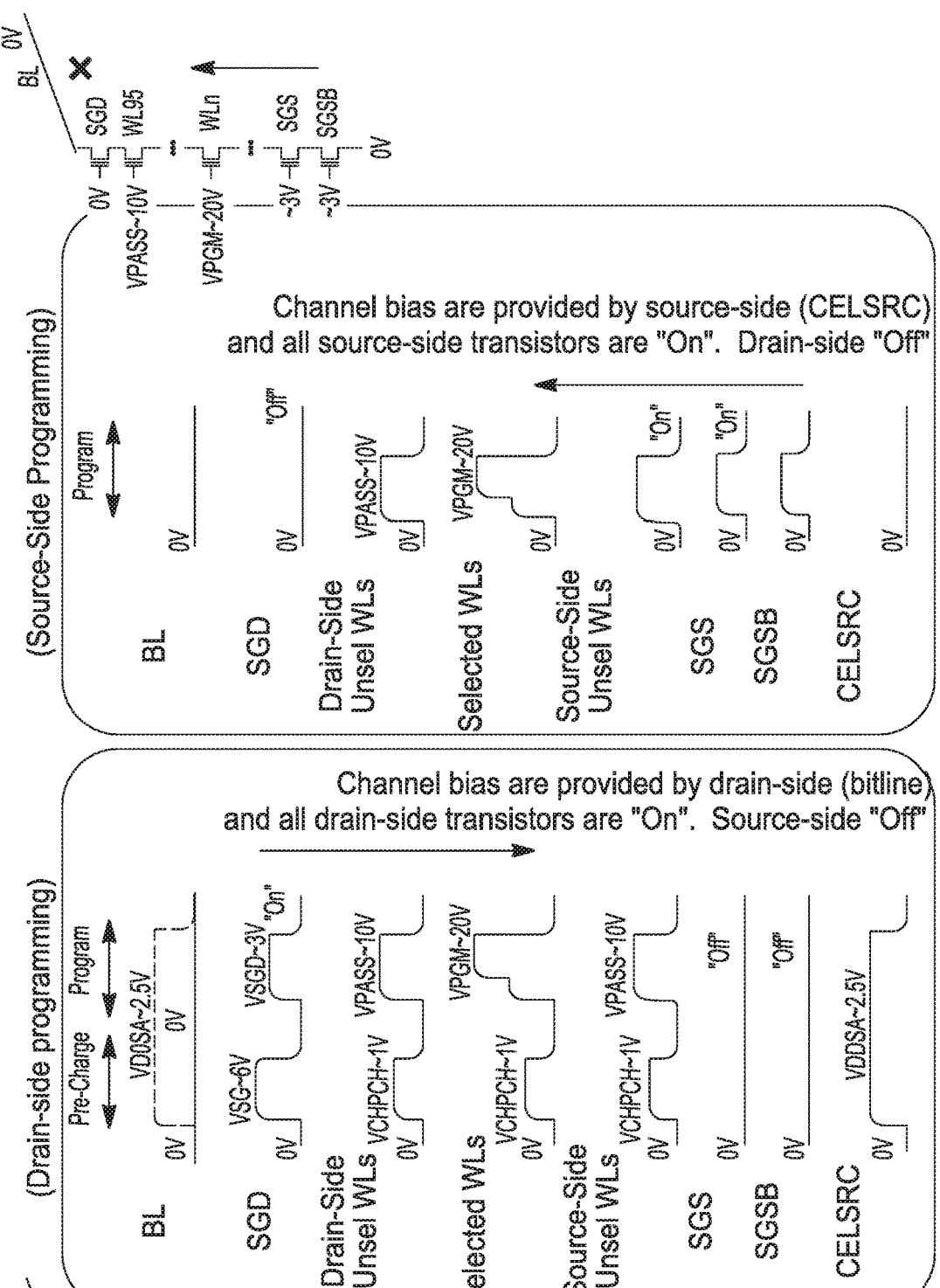
FIG. 6A illustrates states of various lines of a block during related art drain-side programming.
FIG. 6B illustrates states of various lines of a block during source side programming according to an exemplary embodiment.

FIG. 6A illustrates states of the bit line BL, the SGD, the drain-side unselected word lines (WLs), the selected word lines WLs, the source-side unselected WLs, the source side select gate (SGS), the bottom source side select gate (SGSB), and the memory cell source line (CELSRC) during related art drain-side programming.

As noted above, according to the related art, programming is drain side programming, meaning that anything above the selected word line (i.e. on the drain side of the word line to be programmed) is turned on and anything below the selected word line (i.e. on the source side of the word lien to be programmed) is cut off. The programming signal is delivered from the bit line on the drain side while the source side below the selected cell is cut off.

The programming includes the pre-charge phase and the program phase. During the pre-charge phase, 0V is put on the program bit line BL and an inhibit voltage is put on the inhibit line (the dotted line). The SGD voltage is high during both the pre-charge phase and the program phase. The drain-side unselected WLs are also turned on during both the pre-charge phase and the program phase, such that the corresponding transistors are turned off. The pre-charge voltage VCHPCH and the program voltage VPGM are applied to the selected word line during the pre-charge phase and the program phase, respectively. There is some voltage on the source-side unselected WLs. Notably, the source side select gate SGS and the bottom source side select gate SGSB are turned off. The memory cell source line CELSRC provides the source side voltage and is ramped up to about 2.5V, for example, in order to make sure that the source side select gate SGS and the bottom source side select gate SGSB are perfectly cut off.

FIG. 6B illustrates states of the bit line BL, the SGD, the drain-side unselected WLs, the selected WLs, the source-side unselected WLs, the source side select gate SGS, the bottom source side select gate SGSB, and the memory cell source line CELSRC during source side programming according to the first exemplary embodiment.

According to the first exemplary embodiment, in contrast to the related art drain-side programming, the drain side bit line BL and the SGD are maintained at 0V, and are thereby cut off, and the VPGM is applied from the source side. In this embodiment, the source side select gate and the bottom source side select gate are driven at VSGS to make sure the source side transistors are turned on. At the same time the cell side source line CELSRC is driven at 0V. Thus, in contrast to the related art drain-side programming, according to the second exemplary embodiment, the 0V is delivered to the selected cell from the source side rather than the drain side.

There are three places in which source-side programming may be implemented. For example, during a die sort process, after wafer fabrication, during manufacture. In a die sort process, tests are performed in which source-side programming can be implemented. Source-side programming may also be implemented during regular user operation and/or during an erase operation.

Figure 7:
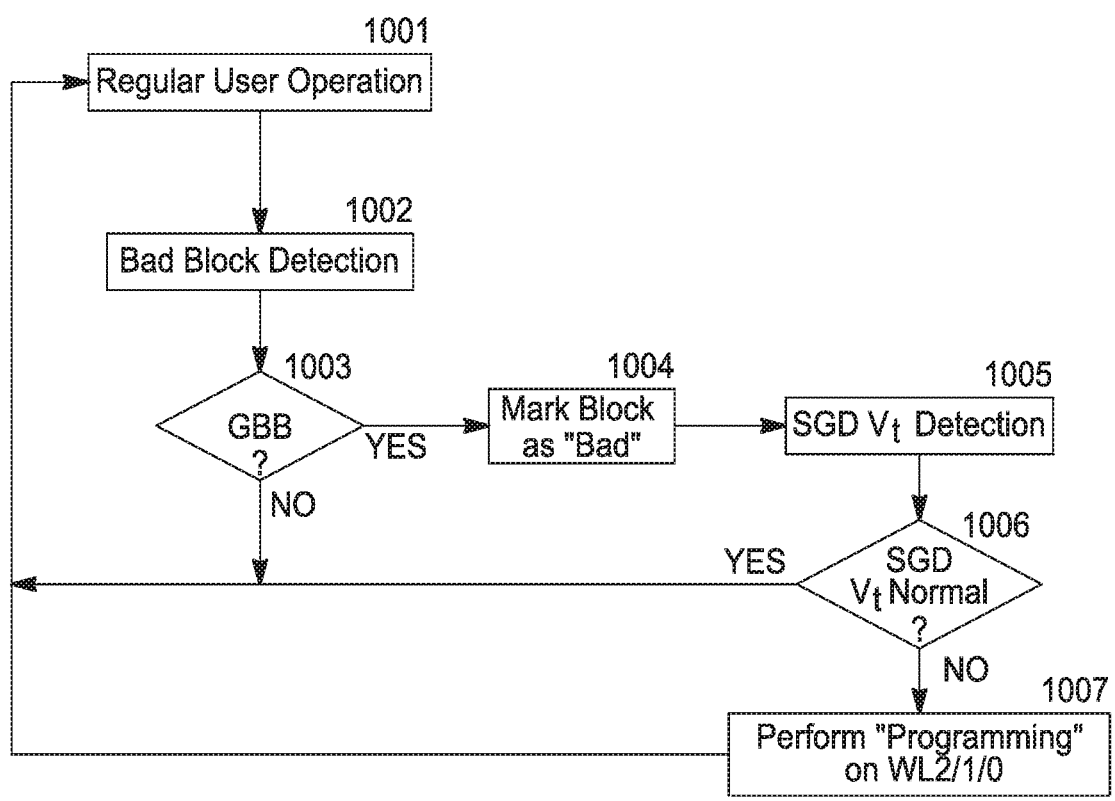
FIG. 7 is a flow chart illustrating a method of bad trigger block isolation, according to an exemplary embodiment.
Figure 8A:
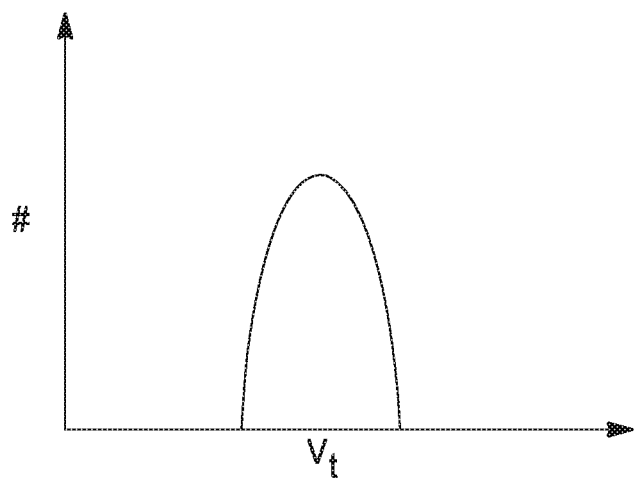
FIG. 8A illustrates an exemplary normal Vt distribution.
Figure 8B:
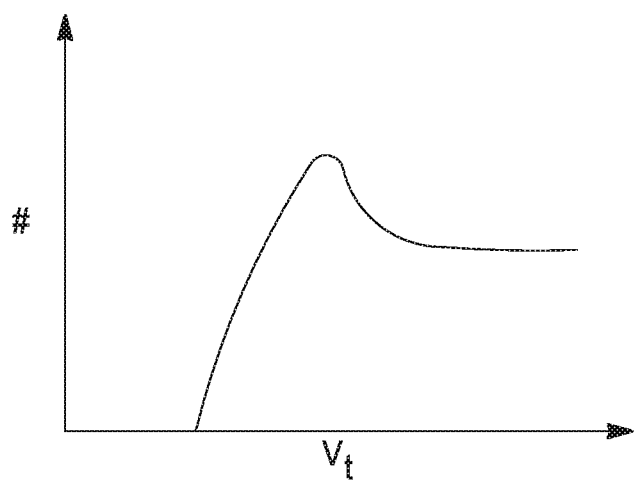
FIG. 8B illustrates an exemplary abnormal Vt distribution.

FIG. 7 is a flow chart illustrating a method of bad trigger block isolation, according to a second exemplary embodiment. During regular user operation (1001), bad block detection is performed (1002). If it is determined that a block is not a bad block (1003: NO), the regular user operation continues (1001). If it is determined that a block is a bad block (1003: YES), the block is marked as bad (1004). It is then determined whether the bad block is a bad trigger block. To do this, the SGD threshold voltage (SGD Vt) is detected (1005). Ideally, the SGD Vt should be a very narrow Vt distribution (e.g. centered around 2.5V), as shown in FIG. 8A. If such a narrow SGT Vt distribution is detected, the block is determined to be a bad block, but not a bad trigger block (1006: YES). However, if there is an open circuit, as with a bad trigger block, the SGD Vt distribution will be a wide distribution with a very high left tail, as shown, for example, in FIG. 8B. If an abnormal SGD Vt distribution is detected, the block is determined to be a bad trigger block (1006: NO). In this case, the word lines WL0, WL1, and WL2 in the bad trigger block are programmed to a high Vt state as discussed above (1007).

Figure 9:
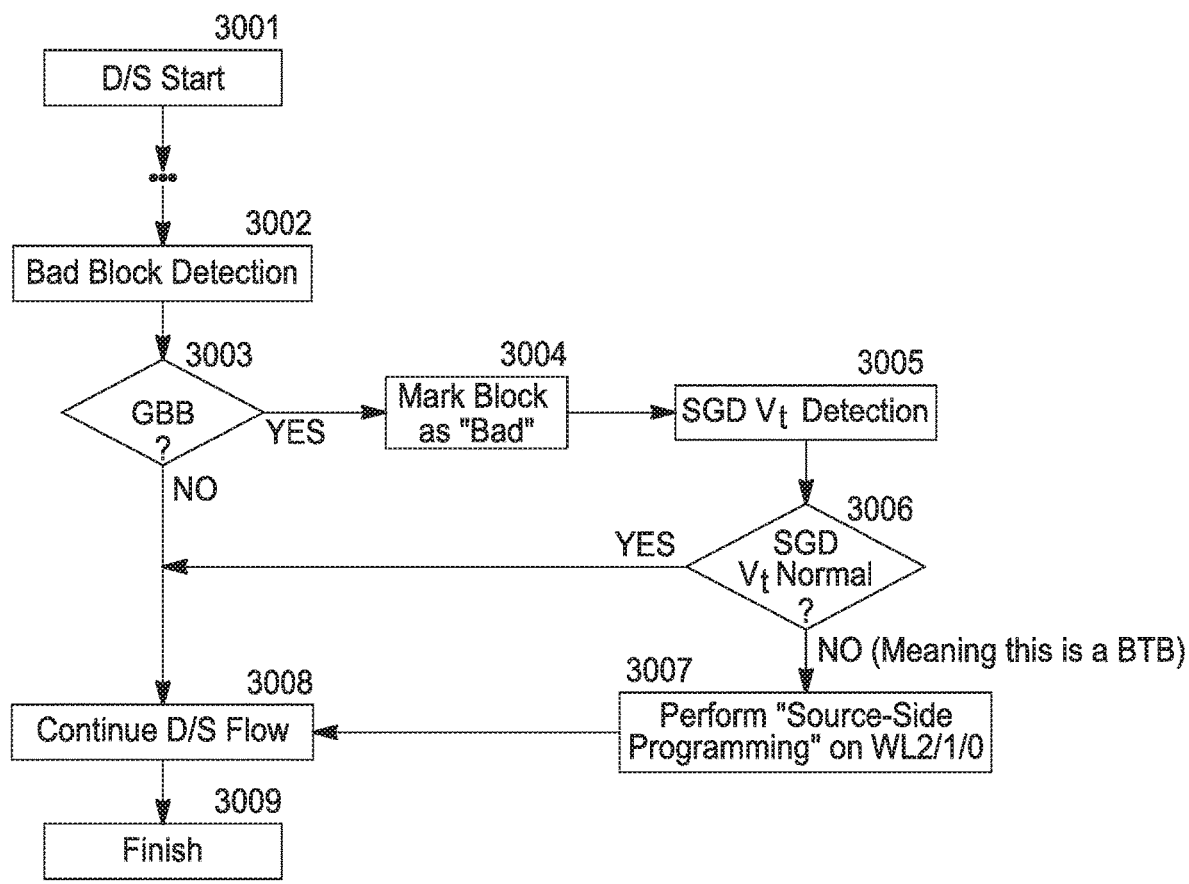
FIG. 9 illustrates a flow chart of a programming method incorporating source-side programming in a die sort process, according to an exemplary embodiment.

FIG. 9 illustrates a flow chart of a programming method incorporating source-side programming in a die sort process, according to a third exemplary embodiment. According to this exemplary method, during the die sort process (3001), a bad block may be detected (3002). According to this embodiment, a detected bad block may be a grown bad block (GBB) (3003). There may be two different types of bad blocks: a bad block which is bad from the beginning, and a bad block which begins as a good block, but, over time, develops a fault. In this case, the fault is "grown," and the bad block may be referred to as a grown bad block (GBB). If the block is not a bad block (3003: NO), the die sort process continues (3008) until it is finished (3009). IF the block is determined to be a bad block (3003: YES), the block is marked as a bad block (3004), and it is determined whether the block is a bad trigger block (3005). In this embodiment, the determination of whether the block is a bad trigger block (3005 and 3006) is the same as described above with respect to FIG. 7, and will not be repeated here. In this case, if it is determined that the block is a bad trigger block (3006: NO), source-side programming is performed on word lines WL2, WL1, and WL0. It should be noted that three word lines are described here with respect to the source-side programming. However, the source side programming of this operation may be performed on any of various numbers of word lines as would be understood by one of skill in the art.

Figure 10:
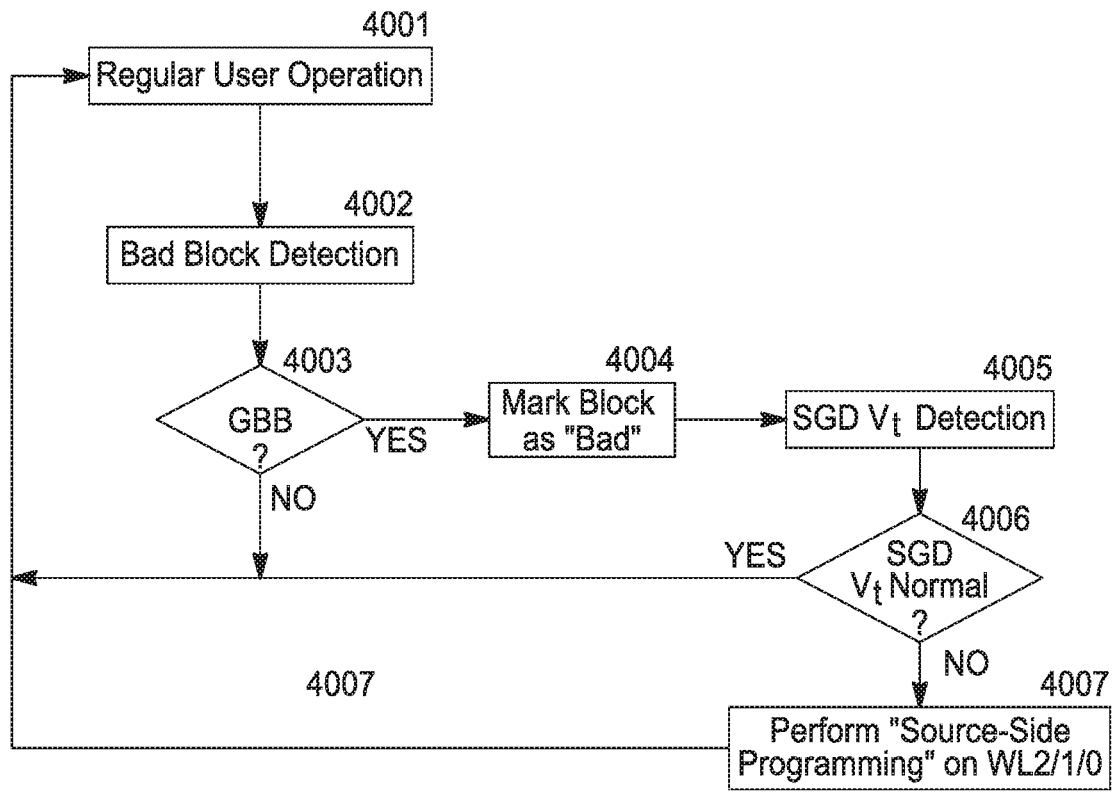
FIG. 10 illustrates a flow chart of a programming method incorporating source-side programming during regular user operation, according to an exemplary embodiment.

FIG. 10 illustrates a flow chart of a programming method incorporating source-side programming during regular user operation, according to a fourth exemplary embodiment. According to this exemplary method, during regular user operation (4001), a bad block may be detected (4002). In this embodiment, the discovery of a bad block (4003), the marking of the bad block (4004), and the determination of whether the bad block is a bad trigger block (4005 and 4006) are the same as described above with respect to FIGS. 7 and 9, and will not be repeated here. In this case, if it is determined that the bad block is a bad trigger block (4006: NO), source side programming is performed (4007).

Figure 11:
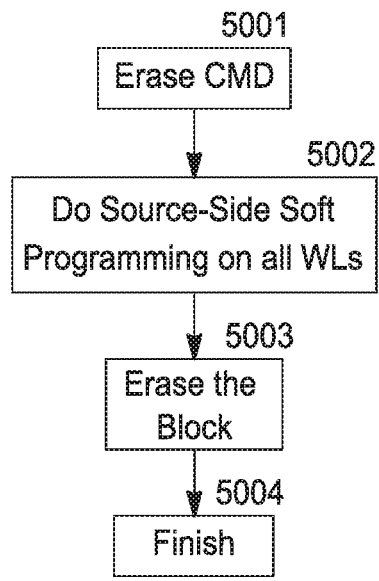
FIG. 11 illustrates a flow chart of an erase method incorporating source-side programming, according to an exemplary embodiment.

FIG. 11 illustrates a flow chart of an erase method incorporating source-side programming, according to a fifth exemplary embodiment. According to this exemplary method, the erase method includes, prior to erasing the block, performing some programming operations. This is called "soft programming." After programming is performed on a block, cells will have different Vt states. In this situation, if erase is performed, cells which were already erased will have a problem of being "over erased." Thus, soft programming is performed, prior to erasing, in order to ensure that the Vt states are similar and in a state in which over erasing will not occur. In the method of the fourth exemplary embodiment, when an erase command is received (5001), source-side soft programming is performed (5002). In this operation, the soft programming is performed from the source-side. Then, the block is erased (5003), and the method is complete (5004).

Figure 12:
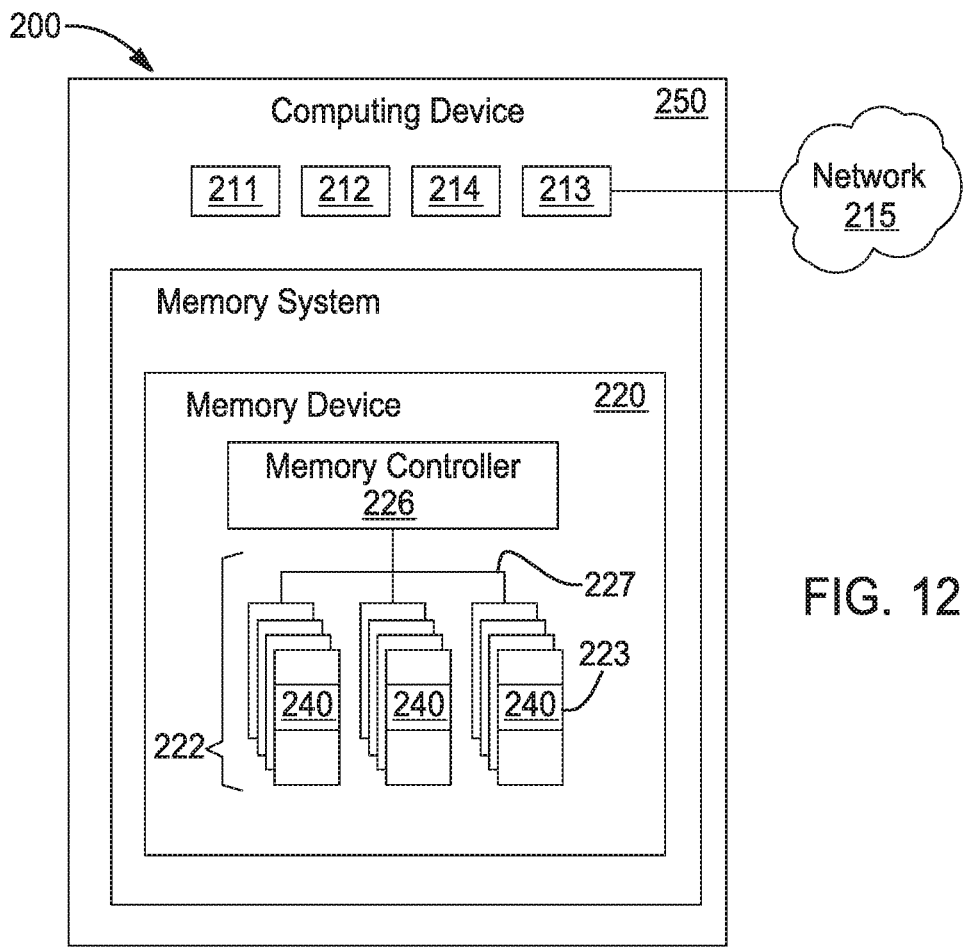
FIG. 12 is schematic block diagram illustrating a system and device according to an exemplary embodiment.

FIG. 12 is schematic block diagram illustrating a system 200 and device 250 configured to implement the methods of any one or more of the exemplary embodiments discussed with respect to FIGS. 6A, 6B, 7, 9, 10, and 11, according to an exemplary embodiment. The computing device 250 comprises one or more program circuits 240 for memory media 222 of a memory device 220.

The memory device 220 may at least partially operate on and/or in communication with the memory system 200 of a computing device 250 which can include a processor 211, a volatile memory 212, and a communication interface 213.

The processor 211 can include one or more central processing units (CPU), one or more general-purpose processors, one or more application-specific processors, one or more processor cores, or the like.

The program circuit 240 can be disposed at or toward an edge and/or peripheral of a memory element 223, adjacent and/or next to an array of memory media 222. Alternately, the program circuit may be disposed on a different level, layer, and/or plane of an integrated circuit device than an array of memory media 222 (e.g. CMOS or other circuit under the array, parallel with and offset from the array, or the like). The program circuit 240 may automatically perform the operations of the methods of exemplary embodiments described herein including, but not limited to for example, automatically performing bad block detection, automatically marking a bad block as "bad," automatically performing SGD Vt detection, automatically determining if a detected SGD Vt distribution is normal; automatically holding drain side lines (including a drain side BL and SGD) at 0V, and automatically applying a program voltage to one or more word lines from a source side.

Figure 13:
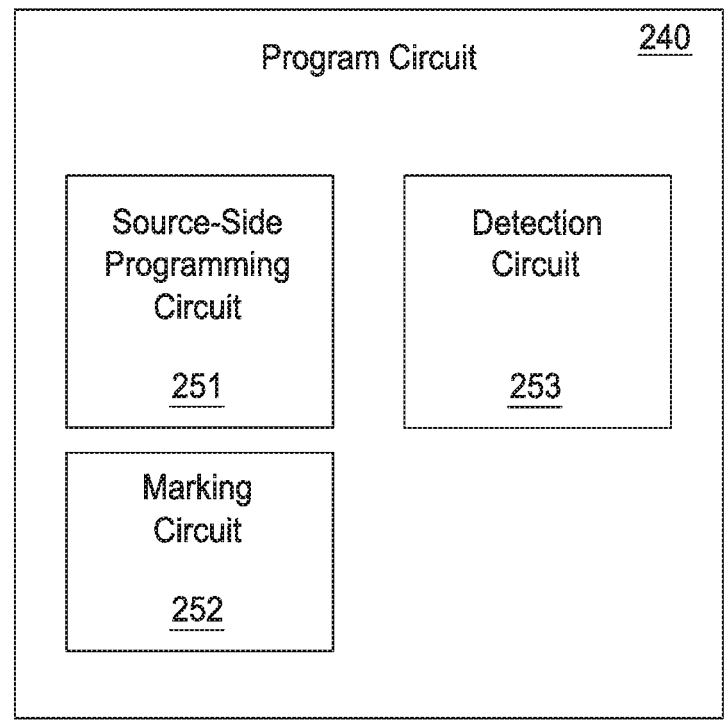
FIG. 13 is a block diagram illustrating a program circuit according to an exemplary embodiment.

FIG. 13 is a block diagram illustrating a program circuit according to an exemplary embodiment. The program circuit 240 includes a source-side programming circuit 251, a detection circuit 253, and a marking circuit 252. The state source-side programming circuit may be any circuit configured to execute or deliver one or more program loops and/or one or more additional program loops in which drain side lines are maintained at 0V and a programming voltage is applied from a source-side. For example, the source-side programming circuit 251 may be configured to perform any one or more of operations 1007, 2002A, 2002B, 3007, 4007, and 5002 as described herein with reference to FIGS. 6A, 6B, 7, 9, 10, and 11.

The detection circuit may be any circuit configured to determine whether a block is a bad block and/or whether a bad block is a bad trigger block, as described herein. For example, the detection circuit may be configured to perform any one or more of operations 1002, 1003, 1005, 1006, 2001, 30002, 3003, 3005, 3006, 4002, 4003, 4005, and 4006, as described herein with reference to FIGS. 6A, 6B, 7, 9, and 10.

The marking circuit 252 may be any circuit configured to mark a block as a trigger block, as described herein.

The memory device 250 may be disposed in any one or more various locations with respect to the computing device 210, and may include one or more memory elements 223, such as semiconductor chips or packages or other integrated circuit devices disposed on one or more printed circuit boards, storage housings, and/or other mechanical and/or electrical support structures. For example, the memory device 250 can comprise one or more direct inline memory module (DIMM) cards, one or more expansion cards and/or daughter cards, a memory card, a universal serial bus (USB) drive, a solid-state-drive (SSD) or other hard drive device, and/or can have another memory and/or storage form factor. The memory device 250 can be integrated with and/or mounted on a motherboard of the computing device 210, installed in a port and/or slot of the computing device 210, installed on a different computing device 210 and/or a dedicated storage appliance on a network 215, in communication with the computing device 210 over an external bus (e.g., an external hard drive), or the like.

An element 223 of memory media 222 may include volatile memory medium 222, such as random-access memory (RAM), dynamic RAM (DRAM), synchronous DRAM (SDRAM), double data rate (DDR) SDRAM, static RAM (SRAM), thyristor RAM (T-RAM), zero-capacitor RAM (Z-RAM), or the like. Alternately, an element 223 of memory media 222 may include a non-volatile memory medium 222, such as ReRAM, Memristor memory, programmable metallization cell memory, phase-change memory (PCM, PCME, PRAM, PCRAM, ovonic unified memory, chalcogenide RAM, or C-RAM), NAND flash memory (e.g., 2D NAND flash memory, 3D NAND flash memory), NOR flash memory, nano random access memory (nano RAM or NRAM), nanocrystal wire-based memory, silicon-oxide based sub-10 nanometer process memory, graphene memory, Silicon-Oxide-Nitride-Oxide-Silicon (SONOS) memory, programmable metallization cell (PMC) memory, conductive-bridging RAM (CBRAM), magneto-resistive RAM (MRAM), magnetic storage media (e.g., hard disk, tape), optical storage media, or the like. Thus, the memory device 250 may rely, for example, on stored voltage levels or stored resistance levels. The one or more elements 223 of memory media 222, in certain embodiments, comprise storage class memory (SCM).

The memory device 250 may be disposed on a memory bus of a processor 211 (e.g., on the same memory bus as the volatile memory 212, on a different memory bus from the volatile memory 212, in place of the volatile memory 212, or the like). Alternately, the memory device 250 may be disposed on a peripheral bus of the computing device 210, such as a peripheral component interconnect express (PCI Express or PCIe) bus, a serial Advanced Technology Attachment (SATA) bus, a parallel Advanced Technology Attachment (PATA) bus, a small computer system interface (SCSI) bus, a FireWire bus, a Fibre Channel connection, a Universal Serial Bus (USB), a PCIe Advanced Switching (PCIe-AS) bus, or the like. Alternately, the memory device 250 may be disposed on a data network 215, such as an Ethernet network, an Infiniband network, Small Computer System Interface (SCSI) remote direct memory access (RDMA) over a network 215, a storage area network (SAN), a local area network (LAN), a wide area network (WAN) such as the Internet, another wired and/or wireless network 215, or the like.

The computing device 210 can additionally include a non-transitory, computer readable storage medium 214. The computer readable storage medium 214 can have stored thereon executable instructions configured to cause the computing device 210 (e.g., processor 211) to perform steps of one or more of the methods described herein. For example, a program circuit 240 can include hardware of a memory element 223, computer executable program code of a device driver, firmware of a memory controller 226 and/or a memory media controller for a memory element 223, another electrical component, or the like. A program circuit 240 may be integrated on a memory element 223 (e.g., an on-die subgroup selection circuit and/or other integrated hardware). The non-volatile memory controller 226 can be communicatively coupled to the non-volatile memory media 222 by way of a bus 227.

The memory device 250 may include a memory controller 224 which manages one or more memory devices 250 and/or memory elements 223, one or more of which can comprise an on-die program circuit 240. The memory device(s) 250 may include recording, memory, and/or storage devices, such as solid-state storage device(s) and/or semiconductor storage device(s) that are arranged and/or partitioned into a plurality of addressable media storage locations. As used herein, a media storage location refers to any physical unit of memory (e.g., any quantity of physical storage media on a memory device 250). Memory units and/or regions can include, but are not limited to: pages, memory divisions, blocks, sectors, collections or sets of physical storage locations (e.g., logical pages, logical blocks), or the like.

It may be understood that the exemplary embodiments described herein may be considered in a descriptive sense only and not for purposes of limitation. Descriptions of features or aspects within each exemplary embodiment may be considered as available for other similar features or aspects in other exemplary embodiments.

While exemplary embodiments have been described with reference to the figures, it will be understood by those of ordinary skill in the art that various changes in form and details may be made therein without departing from the spirit and scope as defined by the following claims.

What is claimed is:

1. A programming method comprising:
   determining that a block, of a plurality of blocks of a memory cell array, includes a fault;
   upon determination that the block includes a fault, marking the block as a bad block;
   detecting a threshold voltage distribution on a drain side select gate of the bad block;
   determining whether the threshold voltage distribution is abnormal; and
   if the threshold voltage distribution is abnormal, applying a voltage to at least one word line of the bad block via a source-side of the memory cell array.

2. The programming method according to claim 1, wherein the memory cell array is 3D NAND flash memory.

3. The programming method according to claim 1, wherein the at least one word line comprises three word lines closest to the source side of the memory cell array.

4. The programming method according to claim 1, wherein the applying the voltage to the at least one word line of the bad block via the source-side of the memory cell array comprises:
   driving a drain-side bit line and a drain side select gate of the bad block at 0V;
   applying a non-zero voltage to a source side select gate of the bad block; and
   driving a source line connected to the bad block at 0V.

5. A non-volatile memory storage system comprising:
   a memory cell array comprising a plurality of blocks of memory cells; and
   a programming circuit comprising:
   a marking circuit configured to, upon determination that a block, of the plurality of blocks, includes a fault, marking the block as a bad block;
   a detection circuit configured to detect a threshold voltage distribution on a drain side select gate of the bad block and to determine whether the threshold voltage distribution is abnormal; and
   a source-side programming circuit configure to, upon determination that the threshold voltage is abnormal, applying a voltage to at least one word line of the bad block via a source-side of the memory cell array.

6. The system according to claim 5, wherein the memory cell array is a 3D NAND flash memory.

7. The system according to claim 5, wherein the at least one word line comprises three word lines closest to the source side of the memory cell array.

8. The system according to claim 5, wherein the source-side programming circuit is further configured to apply the voltage to the at least one word line by:
   driving a drain side bit line and a drain side select gate of the bad block at 0V;
   applying a non-zero voltage to a source side select gate of the bad block; and
   driving a source line connected to the bad block at 0V.

9. A non-transitory computer-readable medium having recorded thereon a program which, when executed by a processor, causes the processor to execute a method comprising:
   determining that a block, of a plurality of blocks of a memory cell array, includes a fault;
   upon determination that the block includes a fault, marking the block as a bad block;
   detecting a threshold voltage distribution on a drain side select gate of the bad block;
   determining whether the threshold voltage distribution is abnormal;
   if the threshold voltage distribution is abnormal, applying a voltage to at least one word line of the bad block via a source-side of the memory cell array.

10. The non-transitory computer-readable medium according to claim 9, wherein the memory cell array is 3D NAND flash memory.

11. The non-transitory computer-readable medium according to claim 9, wherein the at least one word line comprises three word lines closest to the source side of the memory cell array.

12. The non-transitory computer-readable medium according to claim 9, wherein the applying the voltage to the at least one word line of the bad block via the source-side of the memory cell array comprises:
   driving a drain-side bit line and a drain side select gate of the bad block at 0V;
   applying a non-zero voltage to a source side select gate of the bad block;
   driving a source line connected to the bad block at 0V.

* * * * *